United States Patent
Wang et al.

(10) Patent No.: US 6,844,999 B2
(45) Date of Patent: Jan. 18, 2005

(54) BORON DOPED COFE FOR GMR FREE LAYER

(75) Inventors: Hui-Chuan Wang, Pleasanton, CA (US); Chyu-Jiuh Torng, Pleasanton, CA (US); Yun-Fei Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 164 days.

(21) Appl. No.: 10/238,768

(22) Filed: Sep. 10, 2002

(65) Prior Publication Data

US 2004/0047086 A1 Mar. 11, 2004

(51) Int. Cl.⁷ .............................. G11B 5/127; G11B 5/33
(52) U.S. Cl. ................................................. 360/324.12
(58) Field of Search ...................... 360/324.1, 324.11, 360/324.12

(56) References Cited

U.S. PATENT DOCUMENTS

| | | | |
|---|---|---|---|
| 5,864,450 A | 1/1999 | Chen et al. | 360/113 |
| 6,072,671 A | 6/2000 | Gill | 360/126 |
| 6,101,072 A | 8/2000 | Hayashi | 360/324 |
| 6,338,899 B1 | 1/2002 | Fukuzawa et al. | 428/332 |
| 6,381,106 B1 * | 4/2002 | Pinarbasi | 360/324.12 |
| 6,447,935 B1 * | 9/2002 | Zhang et al. | 428/692 |
| 6,581,272 B1 * | 6/2003 | Li et al. | 29/603.14 |
| 6,680,827 B2 * | 1/2004 | Li et al. | 360/314 |
| 6,714,444 B2 * | 3/2004 | Huai et al. | 365/171 |
| 2003/0206381 A1 * | 11/2003 | Hou et al. | 360/324.11 |

OTHER PUBLICATIONS

Kanai et al., IEEE Trans. on Magnetics, vol. 32, No. 5, Sep. 1996, pp. 3368–3373.
Kanai et al., IEEE Trans. on Magnetics, vol. 33, No. 5, Sep. 1997, pp. 2872–2874.

* cited by examiner

*Primary Examiner*—George Letscher
*Assistant Examiner*—Christopher R. Magee
(74) *Attorney, Agent, or Firm*—George O. Saile; Stephen B. Ackerman

(57) ABSTRACT

Prior art gains in GMR ratio resulting from use of NiFeCr as a seed layer were offset by the resulting high values obtained for $H_c$ and $H_k$. This problem has been overcome by combining a seed layer of NiCr or NiFeCr with a free layer of boron doped CoFe. Additionally, when using a synthetic pinned layer, further improvement is achieved by using boron doped CoFe for the two antiparallel layers.

28 Claims, 2 Drawing Sheets

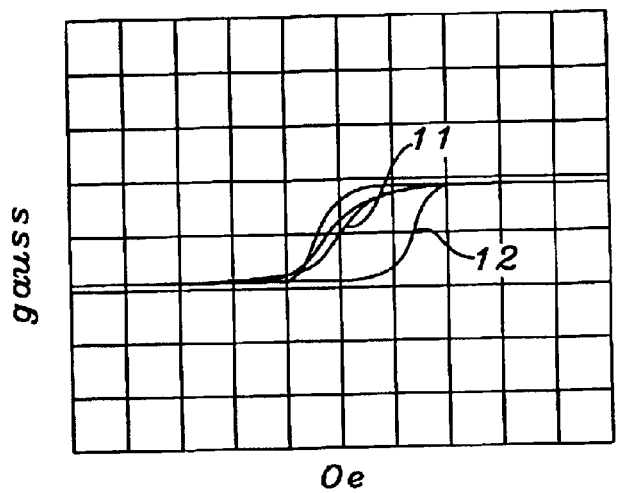
FIG. 1 - Prior Art
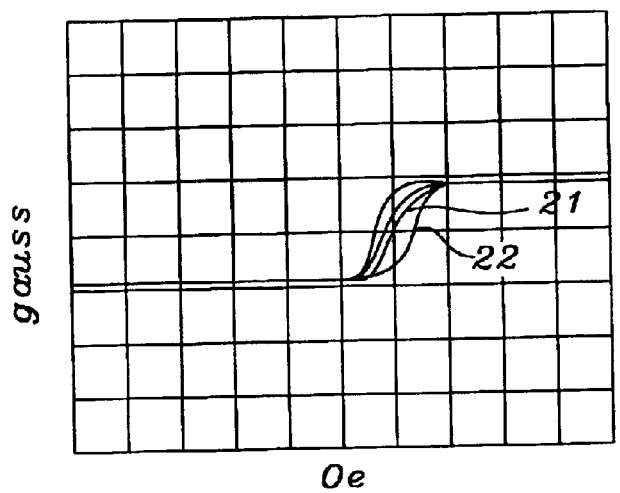
FIG. 2
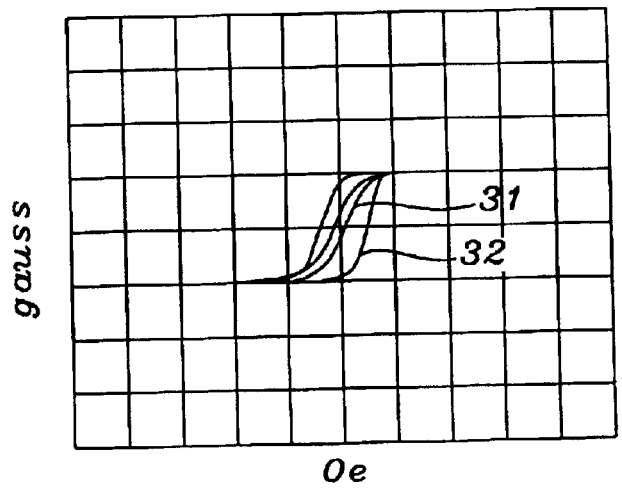
FIG. 3

BORON DOPED COFE FOR GMR FREE LAYER

FIELD OF THE INVENTION

The invention relates to the general field of magnetic disks with particular reference to GMR read heads and their free layers.

BACKGROUND OF THE INVENTION

Magneto-resistance (MR) is the change of resistivity of certain materials in the presence of a magnetic field. This phenomenon is the principle governing the operation of most current magnetic read heads. MR can be significantly increased by means of a structure known as a spin valve or SV. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a low coercivity (free) ferromagnetic layer, a non-magnetic spacer layer, and a high coercivity ferromagnetic layer. The latter is usually formed out of a soft ferromagnetic layer that is pinned magnetically by a nearby layer of antiferromagnetic material. Alternatively, a synthetically pinned device (formed by sandwiching an antiferromagnetic coupling layer between two antiparallel ferromagnetic layers) may be used to replace the ferromagnetic pinned layer. This results in an increase in the size of the pinning field so that a more stable pinned layer is obtained. Also important for the construction of a successful spin valve is the insertion of a seed layer between the substrate and the above mentioned layers. The seed layer serves to influence the crystalline structure of these layers and hence their magnetic properties.

When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers, suffer less scattering. Thus, the resistance at this state is lower. If, however, the magnetization of the pinned layer is anti-parallel to that of the free layer, electrons moving from one layer into the other will suffer more scattering so the resistance of the structure will increase.

Conventionally, spin valves in which the pinned layer is below the free layer are referred to as bottom spin valves (with top spin valves having the pinned layer above the free layer).

The change in resistance, dR (relative to its value R in the absence of a magnetic field) is referred to as the GMR ratio. Its value is typically between about 10 and 15% As magnetic read heads continue to shrink in area it becomes an ongoing challenge to be able to retain a GMR ratio of this order.

An important improvement in the technology was accomplished when it was found that seed layers of NiCr and/or NiFeCr led to significantly larger GMR ratios than did tantalum seeds, which had previously been in widespread use. However, this improvement came at a price. In particular, the coercivity ($H_c$) and the anisotropy field ($H_k$) of the free layer were found to now be much worse (larger) than with a Ta seed. From an application point of view, a free layer with large $H_c$ and $H_k$ is a problem because such a device will show lower sensitivity, bigger hysteresis and impact peak asymmetry as well as stability.

$H_c$ and $H_k$ can both be reduced by using an intrinsically magnetically soft ferromagnetic materials for the free layer. NiFe is a good example of such a material but other processing requirements require the free layer to go through high temperature annealing several times, during which episodes impurities (from the spacer layer) could diffuse into it. The solution to this problem that has been adopted by the prior art has been the insertion of a layer of CoFe between the NiFe layer and the spacer layer, this CoFe/NiFe bilayer now serving as the free layer. Since CoFe is more refractory than NiFe it acts as an effective diffusion barrier. However, it is also much harder (magnetically) than NiFe so the resulting $H_c$ and $H_k$ are not as low as desired. This can be seen in FIG. 1 which is a hysteresis curve for a CoFe layer 5 Å thick. Curve 11 was taken along the easy axis and curve 12 along the hard axis.

The present invention shows how a device having both high GMR ratio and low $H_c$ and $H_k$ can be formed.

A routine search of the prior art was performed with the following references of interest being found:

(1) Kanai et al. IEEE Trans Mag. MAG-32, 3368 (1996)

(2) Kanai et al. IEEE Trans Mag. MAG-33, 2872 (1997)

Ref. (1) teaches that a NiFe/CoFe bilayer gives good results as a free and/or pinned layer while ref. (2) shows that similar or better results can be obtained with a NiFe/CoFeX bilayer.

Other references of interest include U.S. Pat. No. 6,338,899 B1 (Fukuzawa et al.) which shows a free layer of CoFeB. In U.S. Pat. No. 6,101,072, Hayashi discloses a free layer of CoFeB. Gill, in U.S. Pat. No. 6,072,671 makes reference to work on NIFe/CoFeB SV heads while Chen et al. in U.S. Pat. No. 5,864,450, show a CoFeX material layer, but in a different context from the present invention.

SUMMARY OF THE INVENTION

It has been an object of at least one embodiment of the present invention to provide a bottom spin valve having a high GMR ratio together with a low coercivity and a low anisotropy field.

Another object of at least one embodiment of the present invention has been that said spin valve have reduced coupling between the pinned layer and the free layer.

Still another object of at least one embodiment of the present invention has been to provide a process for manufacturing said structure.

These objects have been achieved by combining a seed layer of NiCr or NiFeCr with a free layer of boron doped CoFe. Additionally, when using a synthetic pinned layer, further improvement is achieved by using boron doped CoFe for the two antiparallel layers.

BRIEF DESCRIPTION OF THE DRAWINGS

FIG. 1 is a hysteresis curve for a 5 Angstrom layer of CoFe.

FIGS. 2–4 are hysteresis curves for layers of boron doped CoFe, having thicknesses of 5, 10, and 15 Angstroms respectively.

DESCRIPTION OF THE PREFERRED EMBODIMENTS

The key features of the present invention are:

(1) A single layer of boron doped CoFe is used for the free layer (2) The two ferromagnetic layers that make up the synthetically pinned layer are also boron doped CoFe.

Figure 4:
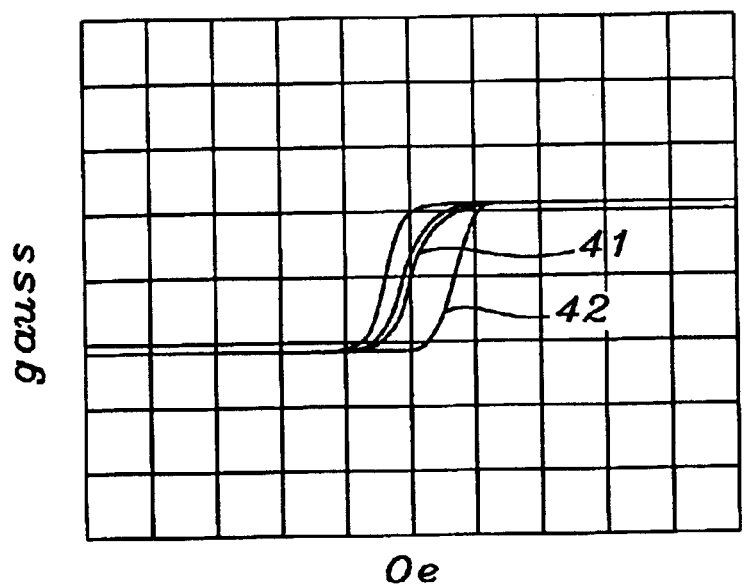

The relevant magnetic characteristics of boron doped CoFe are shown in the hysteresis curves seen in FIGS. 2, 3, and 4. These are for films of CoFe containing 5 atomic % of boron, said films being respectively 5, 10, and 15 Angstroms thick. Curves 21, 31, and 41 were taken along the easy axis while curves 22, 32, and 42 were taken along the hard axis. Data extracted from these curves (as well as from FIG. 1) are summarized in TABLE I below:

TABLE I

| Free layer | Thickness (Å) | $H_c$ (Oe) | $H_k$ (Oe) | GMR ratio (%) |
|---|---|---|---|---|
| CoFe | 5 | 7.90 | 6.53 | 11.2? |
| B-doped CoFe | 5 | 4.66 | 3.33 | 11.19 |
| B-doped CoFe | 10 | 4.66 | 3.37 | 12.29 |
| B-doped CoFe | 15 | 5.80 | 4.25 | 11.66 |

This data makes it clear that the substitution of boron doped CoFe for undoped CoFe leaves the GMR ratio essentially unchanged while significantly reducing both $H_c$ and $H_k$. It is also noteworthy that these quantities are relatively insensitive to film thickness. We can also apply the same principle to the pinned layer. Thus, due to the intrinsic magnetic softness and anisotropy of CoFeBx, if the two antiparallel components of a synthetically pinned layer are made of boron doped CoFe, the associated antiferromagnetic material (such as MnPt, MnPtPd) will have much better pinning properties, such as smaller $H_{opin}$ compared to pure CoFe.

Figure 5:
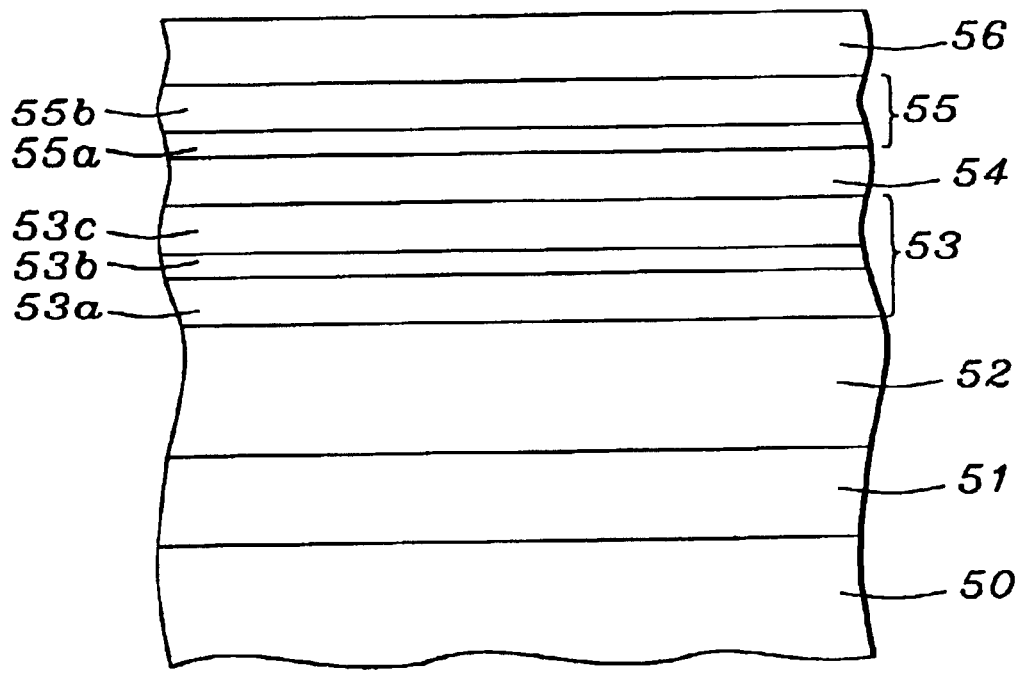
FIG. 5 is a schematic cross-section of the structure of the present invention.

We now present a detailed description of the process of the present invention. In the course of so doing, the structure of the invention will also become apparent:

Referring now to FIG. 5, the process begins with the provision of substrate 50 (such as alumina) and depositing thereon seed layer 51 that is either NiCr or NiFeCr, as discussed earlier. This is followed by the deposition of antiferromagnetic layer 52. Next, pinned layer 53 is deposited. As mentioned earlier, it is commonly a trilayer of two soft ferromagnetic layers (53a and 53c) separated by a layer of an antiferromag-netic coupling material such as ruthenium (layer 53b). Layers 53a and 53c are heated and annealed under suitable conditions so that they end up being magnetized in anti-parallel directions. Layers 53a and 53c each contains between about 50 and 90 atomic % cobalt, between about 5 and 30 atomic % iron, and between about 3 and 20 atomic % boron.

Deposition of non-magnetic spacer layer 54 (typically copper) now follows, after which free layer 55a is laid down. A key feature of the invention is that this layer is boron doped CoFe. This free layer contains between about 70 and 90 atomic % cobalt, between about 5 and 10 atomic % iron, and between about 3 and 20 atomic % boron. Optionally, NiFe layer 55b may be deposited over layer 55a but this is not essential for the successful operation of the finished device. The addition of layer 55b leads to a slight improvement in $H_c$ and $H_k$ at the cost of a slightly smaller GMR value for the same moment.

The process of the present invention concludes with the deposition of capping layer 56 (usually tantalum) on the free layer.

A key benefit of devices formed as described above, is that, as noted earlier, the free layer can have a thickness that is in the range of from about 15 to 100 Angstroms since its coercivity over that thickness range will vary by less than about 10%. Typically, the coercivity is found to be between about 2 and 5 Oersted with an anisotropy field that is between about 3 and 5 Oersted. Furthermore, the inter-layer coupling between the free layer and the pinned layer is less than about 10 Oersted. These favorable performance parameters are achieved while still retaining a GMR ratio that is between about 10 and 15%.

What is claimed is:

1. A process to manufacture a bottom spin valve, comprising:

providing a substrate and depositing thereon a seed layer that contains Ni and Cr;

depositing an antiferromagnetic layer on said seed layer;

depositing a pinned layer on said antiferromagnetic layer;

depositing a non-magnetic spacer layer on said pinned layer;

on said non-magnetic spacer layer, depositing a free layer consisting of boron doped cobalt-iron, interlayer coupling between said free layer and said pinned layer being less than about 10 Oersted; and depositing a capping layer on said free layer.

2. The process described in claim 1 wherein said seed layer is elected from the group consisting of NiCr and NiFeCr.

3. The process described in claim 1 wherein the step of depositing said pinned layer further comprises depositing a layer of ruthenium between two layers of boron doped cobalt-iron and then magnetizing said layers of boron doped cobalt-iron in opposing directions.

4. The process described in claim 3 wherein said two layers of boron doped cobalt-iron each contains between about 50 and 90 atomic % cobalt, between about 5 and 30 atomic % iron, and between about 3 and 20 atomic % boron.

5. The process described in claim 3 further comprising depositing a layer of NiFe between said free layer and said capping layer.

6. The process described in claim 1 wherein said free layer contains between about 70 and 90 atomic % cobalt, between about 5 and 10 atomic % iron, and between about 3 and 20 atomic % boron.

7. The process described in claim 1 wherein said free layer has a thickness that is in the range of from about 15 to 100 Angstroms and a coercivity that varies by less than about 10% over said thickness range.

8. The process described in claim 1 wherein said free layer has coercivity that is between about 2 and 5 Oersted.

9. The process described in claim 1 wherein said free layer has an anisotropy field that is between about 3 and 5 Oersted.

10. The process described in claim 1 wherein said spin valve ha a GMR ratio that is between about 10 and 15%.

11. The process described in claim 1 wherein said spin valve has a seed layer that is NiCr and a GMR ratio that is between about 10 and 15% and a free layer having a coercivity that is between about 2 and 5 Oersted and said free layer has an anisotropy field between about 3 and 5 Oersted.

12. The process described in claim 1 wherein said spin valve has a seed layer that is NiFeCr and a GMR ratio that is between about 10 and 15% and free layer having a coercivity that is between about 2 and 5 Oersted and said free layer has an anisotropy field between about 3 and 5 Oersted.

13. A bottom spin valve, comprising:

a substrate on which is a seed layer that is NiCr;

on said seed layer, an antiferromagnetic layer;

on said antiferromagnetic layer, a pinned layer;

on said pinned layer, a non-magnetic spacer layer;

on said non-magnetic spacer layer, a free layer consisting of boron doped cobalt-iron, said free layer having an anisotropy field that is between about 3 and 5 Oersted; and a capping layer on said free layer.

14. The bottom spin valve described in claim 13 wherein said pinned layer further comprises a layer of ruthenium between two magnetically antiparallel layers of boron doped cobalt-iron.

15. The bottom spin valve described in claim 14 wherein said two layers of boron doped cobalt-iron each contains between about 50 and 90 atomic % cobalt, between about 5 and 30 atomic % iron, and between about 3 and 20 atomic % boron.

16. The bottom spin valve described in claim 13 wherein said free layer contains between about 70 and 90 atomic % cobalt, between about 5 and 10 atomic % iron, and between about 3 and 20 atomic % boron.

17. The bottom spin vale described in claim 13 wherein said free layer has a thickness that is in the range of from about 15 to 100 Angstroms and a coercivity that varies by less than about 10% over said thickness range.

18. The bottom spin valve described in claim 13 wherein said free layer has a coercivity that is between about 2 and 5 Oersted.

19. The bottom spin valve described in claim 13 wherein said free layer has an interlayer coupling between said free layer and said pinned layer that is less than about 10 Oersted.

20. The bottom spin valve described in claim 13 wherein said spin valve has a GMR ratio that is between about 10 and 15% and its free layer has a coercivity that is between about 2 and 5 Oersted.

21. A bottom spin valve, comprising:

a substrate on which is a seed layer that is NiFeCr;

on said seed layer, an antiferromagnetic layer;

on said antiferromagnetic layer, a pinned layer;

on said pinned layer, a non-magnetic spacer layer;

on said non-magnetic spacer layer, a free layer consisting of boron doped cobalt-iron, interlayer coupling between said free layer and said pinned layer being less than about 10 Oersted; and a capping layer on said free layer.

22. The bottom spin valve described in claim 21 wherein said pinned layer further comprises a layer of ruthenium between two magnetically antiparallel layers of boron doped cobalt-iron.

23. The bottom spin valve described in claim 22 wherein said two layers of boron doped cobalt-iron each contains between about 50 and 90 atomic % cobalt, between about 5 and 30 atomic % iron, and between about 3 and 20 atomic % boron.

24. The bottom spin described in claim 21 wherein said free layer contains between about 70 and 90 atomic % cobalt, between about 5 and 10 atomic % iron, and between about 3 and 20 atomic % boron.

25. The bottom spin valve described in claim 21 wherein said free layer has a thickness that is in the range of from about 15 to 100 Angstroms and a coercivity that varies by less than about 10% over said thickness range.

26. The bottom spin valve described in claim 21 wherein said free layer has a coercivity that is between about 2 and 5 Oersted.

27. The bottom spin valve described in claim 21 wherein said free layer has an anisotropy field that is between about 3 and 5 Oersted.

28. The bottom spin valve described in claim 21 wherein said spin valve has a GMR ratio that is between about 10 and 15% and its free layer has a coercivity that is between about 2 and 5 Oersted.

* * * * *